(12) United States Patent
Gabriel et al.

(10) Patent No.: US 6,211,087 B1
(45) Date of Patent: *Apr. 3, 2001

(54) CHEMICAL WET ETCH REMOVAL OF UNDERLAYER MATERIAL AFTER PERFORMING CHEMICAL MECHANICAL POLISHING ON A PRIMARY LAYER

(75) Inventors: Calvin Gabriel, Cupertino; Milind Weling, San Jose, both of CA (US)

(73) Assignee: VLSI Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,718

(22) Filed: Jun. 29, 1998

(51) Int. Cl.[7] .................... H01L 21/302; H01L 21/461
(52) U.S. Cl. .................. 438/691; 438/692; 438/693; 438/747; 438/751
(58) Field of Search ................................ 438/691, 692, 438/693, 747, 749, 750, 751

(56) References Cited

U.S. PATENT DOCUMENTS

| | | | |
|---|---|---|---|
| 5,682,055 | * 10/1997 | Huang et al. | 257/408 |
| 5,789,360 | * 8/1998 | Song et al. | 510/175 |
| 5,889,328 | * 3/1999 | Joshi et al. | 257/751 |
| 5,976,982 | * 11/1999 | Levy et al. | 438/692 |
| 6,001,730 | * 12/1999 | Farkas et al. | 438/627 |

* cited by examiner

Primary Examiner—Carl Whitehead, Jr.
Assistant Examiner—Neal Berezny
(74) Attorney, Agent, or Firm—Douglas L. Weller

(57) ABSTRACT

A primary layer deposited over a secondary layer is planarized. A chemical mechanical polishing process is performed using a slurry which targets the primary layer. Then, chemical etching is performed using a chemical wet etchant which targets the secondary layer. The method is used, for example, when making connections to a lower layer through an insulating layer. Plug holes are formed through the insulating layer to the lower layer. Then the secondary layer is deposited. The secondary layer acts as a barrier layer or a glue layer.

13 Claims, 7 Drawing Sheets

CHEMICAL WET ETCH REMOVAL OF UNDERLAYER MATERIAL AFTER PERFORMING CHEMICAL MECHANICAL POLISHING ON A PRIMARY LAYER

BACKGROUND

The present invention concerns the fabrication of integrated circuits and pertains particularly to the wet etch removal of underlayer material after performing chemical mechanical polishing on a primary layer.

The trend in integrated circuit manufacturing is to increase the amount of circuitry within each individual integrated circuit. Along with this trend there is an increase in the number of layers used and a decrease in the dimensions of the patterned layers.

As the pattern dimensions within integrated circuits shrink in size, it is necessary to provide more accurate methods to accurately and uniformly perform the processing steps.

When processing integrated circuits, masks are utilized to pattern and etch layers of material deposited on a wafer. These layers are composed of, for example, polysilicon, metal or oxide.

As optical resolution increases, the depth of focus of the mask image correspondingly narrows. This is due to the narrow range in depth of focus imposed by the high numerical aperture lenses in photolithography tools which use the mask images. This narrowing depth of focus is often the limiting factor in the degree of resolution obtainable, and thus, the smallest components obtainable using the photolithography. Unevenness in the surface of a wafer exaggerate the effects of decreasing depth of focus. Thus, in order to properly focus the mask image defining sub-micron geometries, a precisely flat (i.e. fully planarized) surface is desired. A fully planarized surface will allow for a small depth of focus, thus aiding in the definition and subsequent fabrication of extremely small components.

Chemical-mechanical polishing (CMP) is generally used to aid in planarization of a wafer. When performing CMP, a sacrificial layer of dielectric material is removed using mechanical contact between a wafer and a moving polishing pad saturated with slurry. Polishing flattens out height differences, and thus planarizes the topography of a wafer.

CMP is widely accepted as the preferred process for planarizing dielectric materials and metal plugs placed on a wafer. This is particularly true when the technology uses dimensions on the order of 0.25 micrometers or smaller. Slurry used in such a CMP process generally includes two parts. The first part is a pH-controlled chemical solution. The second part is an abrasive.

For example, during CMP-based dielectric planarization, the chemical solution may be an aqueous alkaline solution which depolymerizes the glass surface forming soft hydroxides. This chemical solution is used by the abrasive action of colloidal silica particles in the slurry. For additional information on this process, see L. Cook, *Journal of Noncrystalline Solids*, 120,152 (1990).

In metal CMP processes, slurries help to form soft abradable metal oxides which can easily be removed by the mechanical action of the abrasives in suspension. Slurries are typically targeted to remove one particular film and further optimized to remove other secondary films (exposed during CMP) at a certain removal rate (RR). A low removal rate is used if it is desired to stop on the film. A high removal rate is used if polishing of the film is desired.

However, given the many competing requirements for a particular slurry, it may not be feasible to meet the requirement of easily removing secondary films. In such cases, the polishing step is increased in time (which can significantly degrade throughput) or the layer is left behind and removed subsequently during metal etch (but this adds to the metal stack height and the complexity of metal etch). Either solution impacts wafer processing throughput and thus increases the cost of the process.

SUMMARY OF THE INVENTION

In accordance with the preferred embodiment of the present invention, a method is presented for planarizing a primary layer deposited over a secondary layer. A chemical mechanical polishing process is performed using a slurry which targets the primary layer. Then, chemical etching is performed using a chemical wet etchant which targets the secondary layer.

For example, the method is used when making connections to a lower layer through an insulating layer. Plug holes are formed through the insulating layer to the lower layer. Then the secondary layer is deposited. The secondary layer acts as a barrier layer or a glue layer. The primary layer is deposited over the barrier layer. The chemical mechanical polishing process is performed using the slurry which targets the primary layer. Also, the chemical etching is performed which uses the chemical wet etchant which targets the barrier layer.

For example, the primary layer is Tungsten and the secondary layer is Titanium or Titanium Nitride. The chemical wet etchant includes, for example, hydrogen peroxide, and the slurry includes Ferric Nitrate Alumina.

The present invention is most effective when the primary layer is at least five times thicker than the secondary layer and the chemical wet etchant has a removal rate of the primary layer which is lower than the removal rate of the secondary layer.

The present invention allows for an effective method for planarization of a primary layer deposited over a secondary, thinner layer. The present invention decreases the polishing time and thus reduces the erosion in the surrounding oxide and exposed Tungsten layers. The etching on a polisher, as discussed herein, reduces the amount of chemicals required as the combination of down force and contact with a pad improves the etch rate of Titanium and Titanium Nitride

DESCRIPTION OF THE PREFERRED EMBODIMENT

Figure 1:
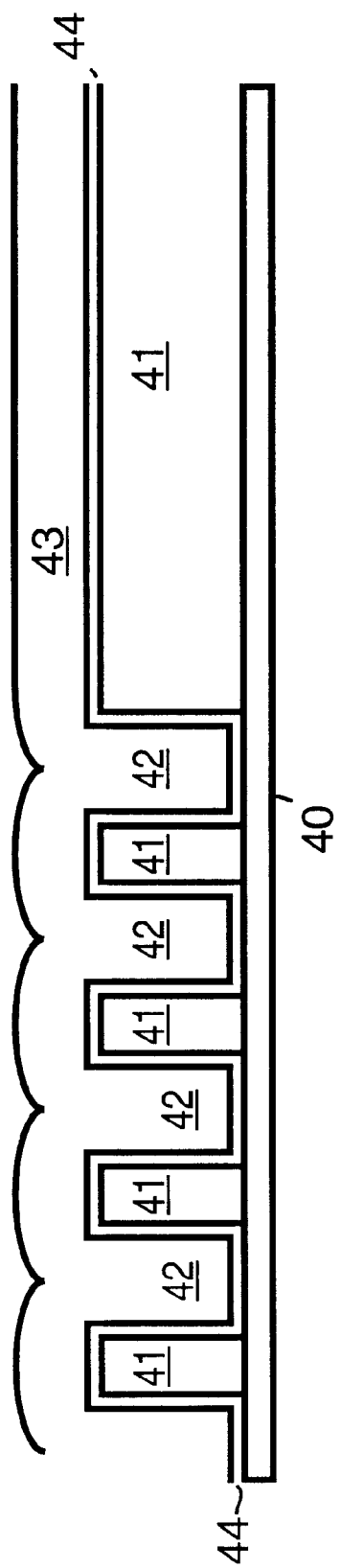
FIG. 1 shows a partial cross-sectional view of an integrated circuit after the deposit of a layer of tungsten (W) over a secondary film of, for example Titanium (Ti) or Titanium Nitride (TiN).

FIG. 1 shows a partial cross-sectional view of an integrated circuit which illustrates the deposit of a first metal layer, such as Tungsten (W) over a secondary film, such as Titanium (Ti) or Titanium Nitride (TiN).

More specifically, in order to allow for connections to a layer 40 which consists of, for example, metal, polysilicon or doped silicon, plug holes 42 are made through an oxide layer 41. The plug holes are filled with a Tungsten (W) layer 43 which make electrical connection to layer 40.

A glue layer (or barrier layer) 44 is used as a secondary film and is placed on the wafer before W layer 43. For example glue layer 44 is composed of Titanium (Ti) or Titanium Nitride (TiN).

Figure 2:
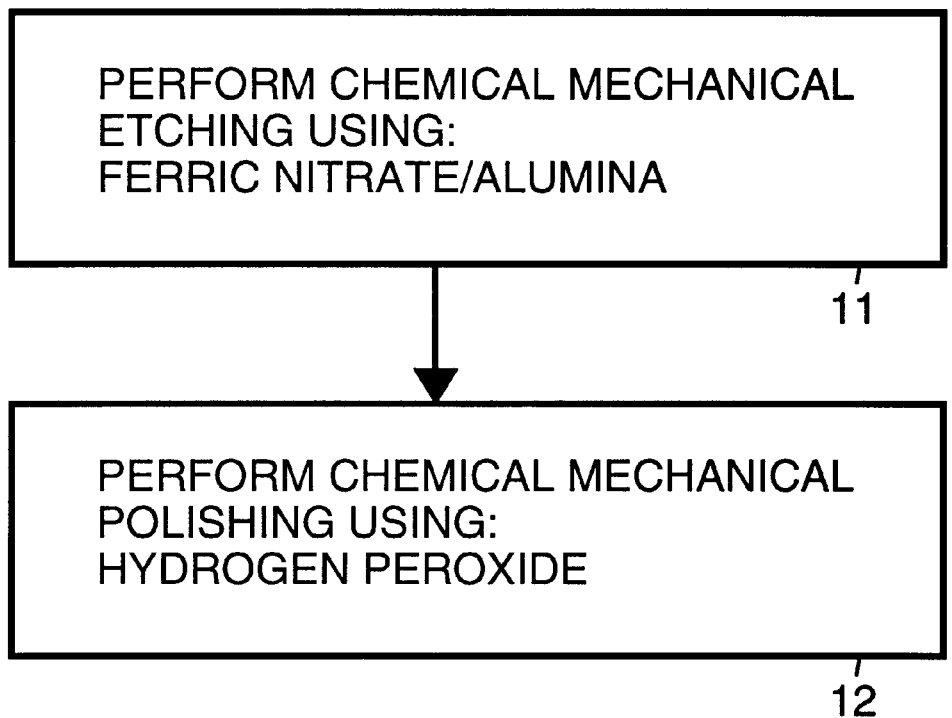
FIG. 2 sets out a method for planarizing the layer of tungsten (W) and the secondary film in accordance with a preferred embodiment of the present invention.

FIG. 2 sets out a method for planarizing layer of tungsten (W) 43 as placed on top of glue layer 44. When performing a CMP process with typical slurries (such as ferric nitrate/alumina) used for removal of W, Ti polishes much slower than W. Typically such a CMP with a slurry targeted for W polishes Ti from one fourth to one tenth as fast as the rate at which W is polished. However, Ti etches at a reasonably rapid rate when CMP is performed using a chemical wet etch such as $H_2O_2$ or $NH_4OH:H_2O_2$:deionized water in the volumetric ratio 1:1:5.

Therefore, in a step 11, a chemical mechanical polishing is performed using ferric nitrate/alumina slurry. In a step 12, a chemical mechanical polishing is performed using a chemical wet etchant such as hydrogen peroxide or ammonium hydroxide/hydrogen peroxide.

While step 11 and step 12 can be performed using a single CMP machine, typically to prevent contamination of subsequent wafer processing, a separate CMP machine is used for each step. The presence of a conditioner is not essential for the present invention.

Figure 3:
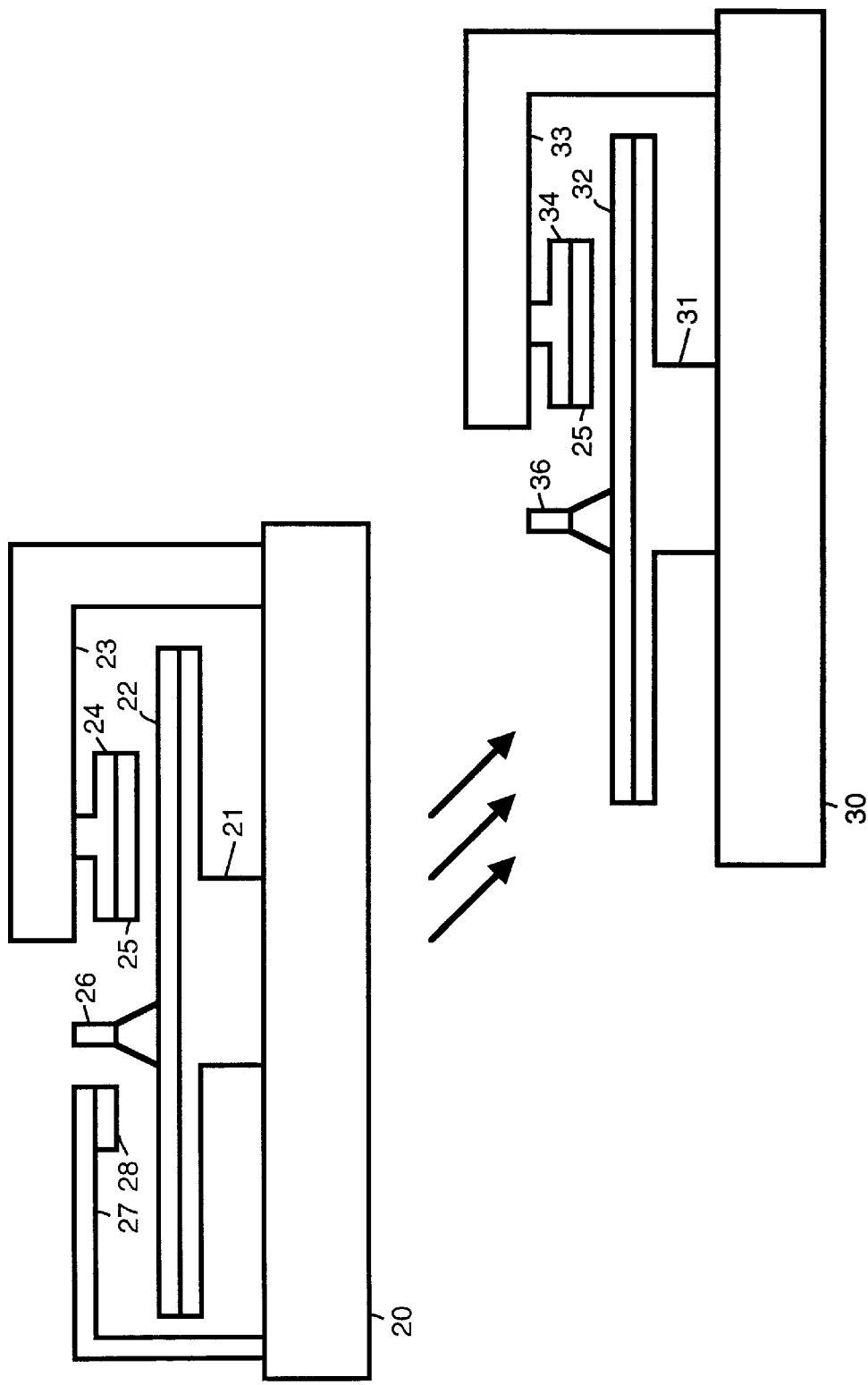
FIG. 3 shows simplified block diagram of two chemical-mechanical polishing (CMP) machines which illustrate the process set out in FIG. 2.

This is illustrated by FIG. 3. In FIG. 3, a CMP machine 20 is fed wafers to be polished. CMP machine 20 picks up the wafers with an arm 23 and places them onto a rotating polishing pad 22. Polishing pad 22 is made of a resilient material and is textured, often with a plurality of predetermined grooves, to aid the polishing process. For example, polishing pad 22 is a Suba 500/Suba IV available from Rodel Inc., having a business address of 451 Bellevue Road, Newark, Del. 19713-3473.

Alternatively, if step 11 and step 12 are performed using a single CMP machine, polishing pad 22 is for example, C223 pad available from Thomas West Inc., in Sunnyvale, Calif. Polishing pads of this type do not absorb chemical etchants and are therefore suitable for eliminating memory effects from chemical-mechanical polishing and chemical etching done on the same platen.

Polishing pad 22 rotates on a platen 21, or turn table located beneath polishing pad 22. A wafer 25 is held in place on polishing pad 22 by arm 23. The lower surface of wafer 25 rests against polishing pad 22. The upper surface of wafer 25 is against the lower surface of a wafer carrier 24 of arm 23. As polishing pad 22 rotates, wafer carrier 24 rotates wafer 25. Arm 23 forces wafer 25 into polishing pad 22 with a predetermined amount of down force. CMP machine 20 also includes a slurry dispense arm 26 extending across the radius of polishing pad 22. Slurry dispense arm 26 dispenses a flow of slurry onto polishing pad 22.

A separate condition line 27 and a separate conditioner dispenser 28 are used to place conditioner on the platen. The conditioner typically is composed of a rotating end-effector, such as a brush or an abrasive disc coated with diamond grit.

Figure 4:
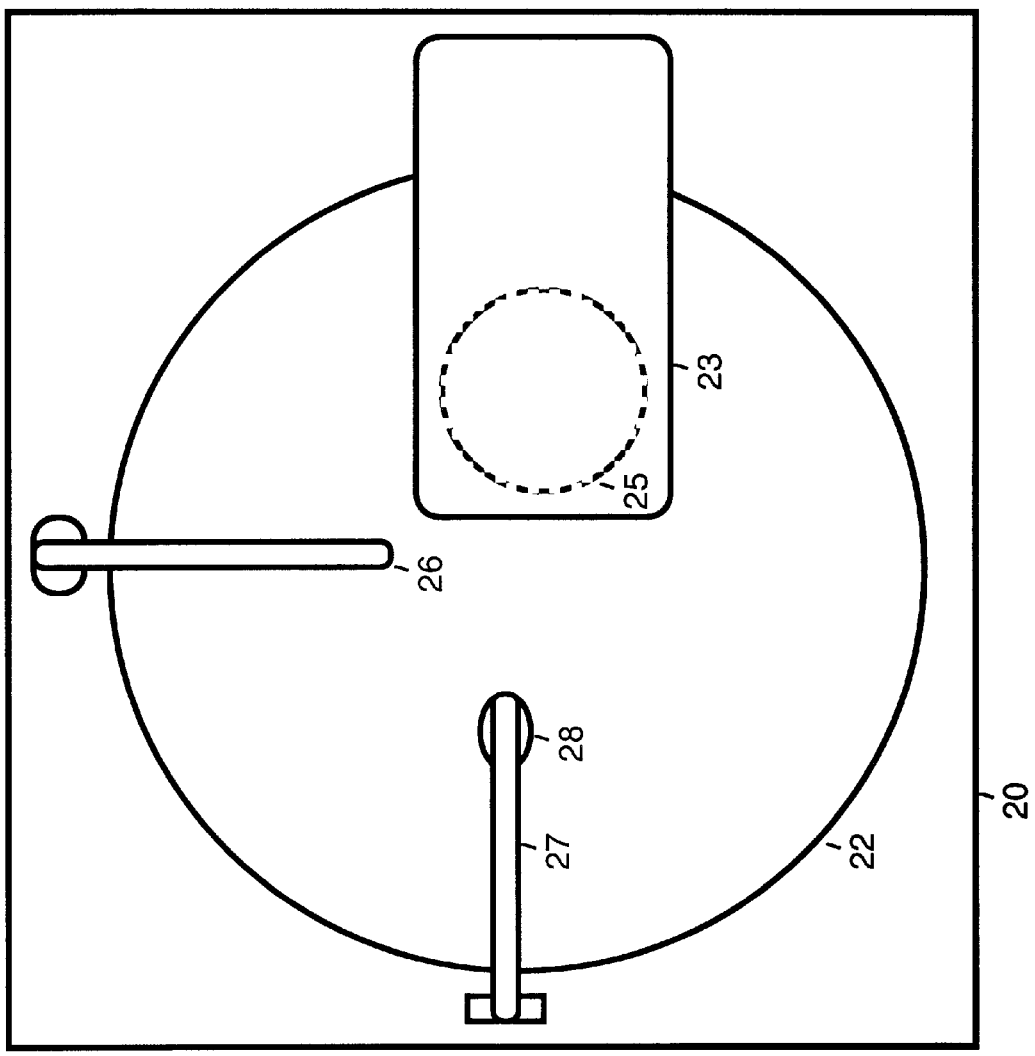
FIG. 4 shows a top view of one of the CMP machine shown in FIG. 3.

FIG. 4 shows a top view of CMP machine 20.

For example, when polishing the W layer 43, slurry dispense arm 26 is used to dispense Ferric Nitrate Alumina at a rate of 200 millimeters per minute. Platen 21 rotates at a speed of 40 rounds per minute (rpm). Carrier 24 rotates at a rate of 45 rpm. Carrier 24 presses wafer 25 onto polishing pad 22 with a down force of 5 pounds per square inch (psi). This results in a W polishing rate of approximately 3100 Angstroms (Å) per minute (min.).

A CMP machine 30 is used to provide for a chemical wet etch targeted for glue layer 44. CMP machine 30 picks up the wafers with an arm 33 and places them onto a rotating polishing pad 32. Polishing pad 32 is made of a resilient material and is textured, often with a plurality of predetermined grooves, to aid the polishing process. For example, polishing pad 32 is a Politex or an IC1000/Suba IV available from Rodel Inc., having a business address of 451 Bellevue Road, Newark, Del. 19713-3473.

Polishing pad 32 rotates on a platen 31, or turn table located beneath polishing pad 32. Wafer 25 is held in place on polishing pad 32 by arm 33. The lower surface of wafer 25 rests against polishing pad 32. The upper surface of wafer 25 is against the lower surface of a wafer carrier 34 of arm 33. As polishing pad 32 rotates, wafer carrier 34 rotates wafer 25. Arm 33 forces wafer 25 into polishing pad 32 with a predetermined amount of down force. CMP machine 30 also includes a chemical wet etchant dispense arm 36 extending across the radius of polishing pad 32. Chemical wet etchant dispense arm 36 dispenses a flow of chemical wet etchant onto polishing pad 32.

Figure 5:
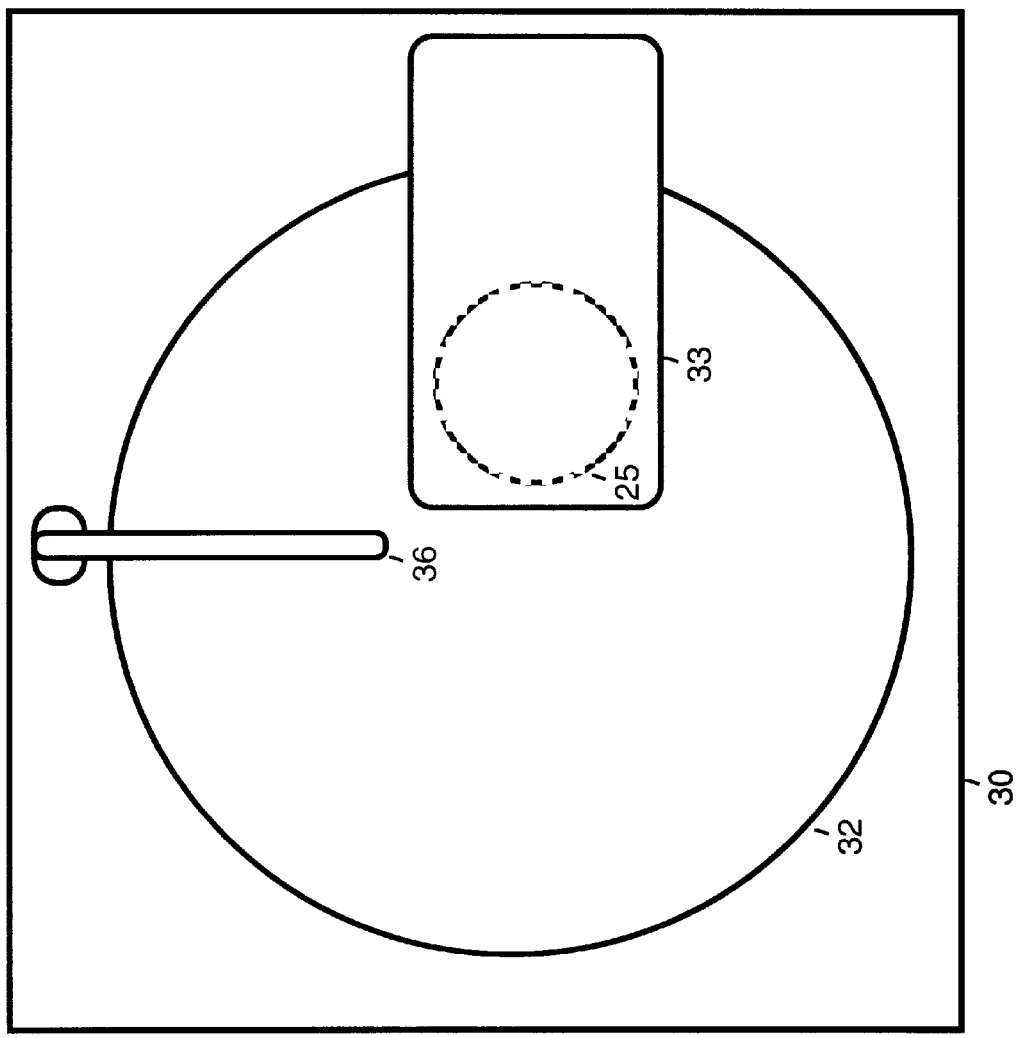
FIG. 5 shows a top view of the other CMP machine shown in FIG. 3.

FIG. 5 shows a top view of CMP machine 30.

Most chemical wet etchants have multiple components that are mixed and are used in large sinks. Depending on the life span of the chemicals after mixing and the sink bath size, there can be excessive wastage of chemicals. Thus, in the preferred embodiment of the present invention, smaller batches of chemicals are mixed on demand. Further savings could be made by using point-of-use volumetric mixing by supplying each chemical component from a separate "chemical wet etchant" line onto the platen.

For example, when polishing the glue layer 44, chemical wet etchant dispense arm 36 is used to dispense Hydrogen Peroxide ($H_2O_2$) at a rate of 150 millimeters per minute. Platen 31 rotates at a speed of 60 rpm. Carrier 34 rotates at a rate of 40 rpm. Carrier 34 presses wafer 25 onto polishing pad 32 with a down force of 5 psi. This results in a polishing rate of greater than 3000 Å/min. when glue layer 44 consists of TiN, and results in a polishing rate of greater than 700 Å/min. when glue layer 44 consists of Ti.

Figure 6:
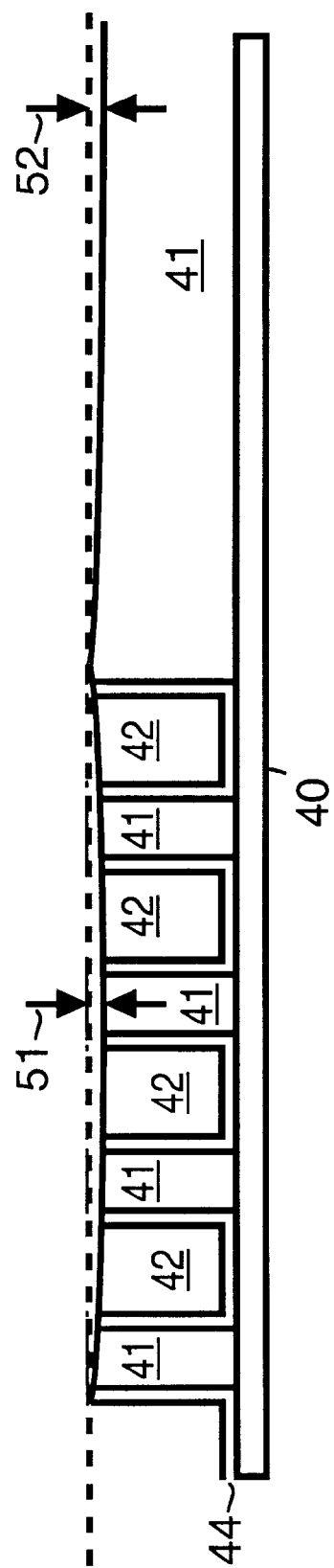
FIG. 6 shows a partial cross-sectional view of an integrated circuit after planarization of the layer of tungsten (W) and the secondary film in accordance with a preferred embodiment of the present invention.

FIG. 6 illustrates the result when the CMP process for Tungsten layer 43 is followed by a chemical wet etch of glue layer 44. The extra erosion represented by arrows 51 and arrows 52 is minimal resulting in a relatively planar surface for wafer 25.

Figure 7:
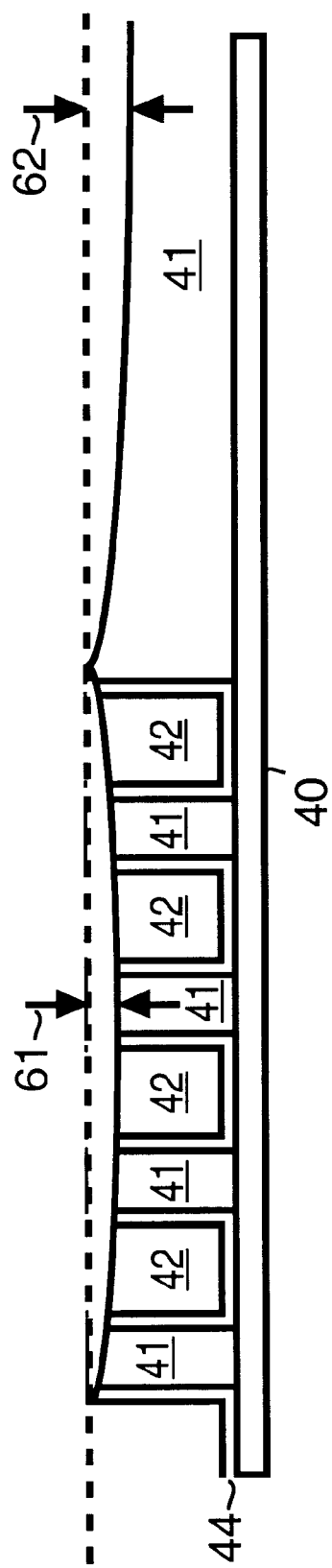
FIG. 7 shows a partial cross-sectional view of an integrated circuit after planarization of the layer of tungsten (W) and the secondary film in accordance with the prior art.

FIG. 7 illustrates the result when only a single CMP process is used which targets Tungsten layer 43. Because of the slow polishing rate of glue layer 44 resulting from the Tungsten slurry, significant additional erosion takes place, as represented by arrows 61 and arrows 62. As represented particularly by arrows 62, the low selectivity of the slurry results in oxide layer 41 being polished, reducing planarity of the wafer. The present invention result in significant alleviation of this problem.

The two step methodology set out herein, whereby a primary layer and a secondary layer or film layer are planarized, works best when the thickness of the secondary (under) layer is significantly thinner (by at least five times compared to the primary layer) so that planarity of the primary layer is not significantly impacted during the use of the chemical wet etch to planarize the secondary layer. Additionally, the chemical wet etchant used in the planarization of the secondary layer should have a relatively low removal rate of the primary layer if the primary layer is still being exposed on the wafer. Additionally, in some cases the slurry and the chemical wet etchant may be incompatible, requiring separate drains for disposal.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for making connections to a lower layer through an insulating layer comprising the following steps:
   (a) forming plug holes through the insulating layer to the lower layer;
   (b) depositing a barrier layer;
   (c) depositing a primary layer directly over the barrier layer, the barrier layer acting to glue the primary layer to the insulating layer;
   (d) performing a chemical mechanical polishing process using a slurry to polish the primary layer; and
   (e) performing chemical etching using a chemical wet etchant to etch the barrier layer and form a substantially planar surface, the chemical wet etchant not being a slurry.

2. A method as in claim 1 wherein the primary layer deposited in step (c) is at least five times thicker than the barrier layer deposited in step (b).

3. A method as in claim 1 wherein in step (e) the chemical wet etchant has a removal rate of the primary layer which is lower than the removal rate of the barrier layer.

4. A method as in claim 1 wherein the primary layer is Tungsten.

5. A method as in claim 4 wherein the barrier layer is composed of at least one of the following materials: Titanium; Titanium Nitride.

6. A method as in claim 5 wherein in step (e) the chemical wet etchant includes hydrogen peroxide.

7. A method as in claim 4 wherein in step (d) the slurry comprises Ferric Nitrate Alumina.

8. A method for forming planarized layers on a semiconductor wafer comprising the following steps:
   (a) depositing a barrier layer on the semiconductor wafer, the barrier layer being placed over an insulting layer;
   (b) depositing a primary layer directly over the barrier layer, the barrier layer acting to glue the primary layer to the insulating layer;
   (c) performing a chemical mechnical polishing process using a slurry to polish the primary layer; and
   (d) performing chemical etching using a chemical wet etchant to etch the barrier layer, the chemical wet etchant not being a slurry.

9. A method as in claim 8 wherein the primary layer deposited in step (b) is at least five times thicker than the barrier layer deposited in step (a).

10. A method as in claim 8 wherein the primary layer is Tungsten.

11. A method as in claim 10 wherein the barrier layer is composed of at least one of the following materials: Titanium; Titanium Nitride.

12. A method as in claim 11 wherein in step (d) the chemical wet etchant includes hydrogen peroxide.

13. A method as in claim 10 wherein in step (c) the slurry comprises Ferric Nitrate Alumina.

* * * * *